(12) United States Patent
Tsadka et al.

(10) Patent No.: US 6,947,206 B2
(45) Date of Patent: Sep. 20, 2005

(54) ALL-OPTICAL, TUNABLE REGENERATOR, RESHAPER AND WAVELENGTH CONVERTER

(75) Inventors: Sagie Tsadka, Emek Soreq (IL); Shalva Ben-Ezra, Rehovot (IL); Haim Chayet, Nes-Ziona (IL); Nir Shachar, Ramat-Gan (IL)

(73) Assignee: Kailight Photonics, Inc., Dallas, TX (US)

( * ) Notice: Subject to any disclaimer, the term of this patent is extended or adjusted under 35 U.S.C. 154(b) by 116 days.

(21) Appl. No.: 10/623,280

(22) Filed: Jul. 18, 2003

(65) Prior Publication Data
US 2005/0012985 A1 Jan. 20, 2005

(51) Int. Cl.[7] .......................... H01S 3/00; H04B 10/02
(52) U.S. Cl. ...................................... 359/333; 398/175
(58) Field of Search ............................. 359/333, 344; 398/175

(56) References Cited
U.S. PATENT DOCUMENTS 6,335,819 B1 * 1/2002 Cho et al. .................. 359/333
6,717,718 B1 * 4/2004 Kelsoe et al. ............... 359/333
6,832,053 B2 * 12/2004 Leuthold .................... 398/175

* cited by examiner

Primary Examiner—Mark Hellner
(74) Attorney, Agent, or Firm—Fulbright & Jaworski LLP

(57) ABSTRACT

The invention consists of a system and method for regenerating and converting optical signals. The invention provides both "2R (i.e. reamplification and reshaping) and "3R" (i.e. reamplification, reshaping, and resynchronization (or retiming)) regeneration. The components of the inventive system include a tunable continuous wave (CW) laser source, an optical circulator, an semiconductor optical amplifier (SOA), and a spectral filter that has a very sharp cutoff frequency. In alternative embodiments, the filter may be replaced with an interleaver that passes several wavelengths. A single interleaver may be used by several of the optical regenerators/converters described herein. Each regenerator uses a separate wavelength that is associated with a passband frequency of the single interleaver. During counter-propagation in the SOA, a CW signal from the CW laser is chirped by bits in an input signal. The chirped signal is then output to the filter, which blocks the original CW signal.

65 Claims, 8 Drawing Sheets

ALL-OPTICAL, TUNABLE REGENERATOR, RESHAPER AND WAVELENGTH CONVERTER

TECHNICAL FIELD

The present invention is directed generally to regeneration and conversion of optical signals and, more particularly, to counter-propagating signals through a semiconductor optical amplifier and filtering the output to regenerate and convert the optical signal.

BACKGROUND

Wave division multiplexing (WDM) or dense wavelength division multiplexing (DWDM) puts data from different sources together on an optical fiber. Each signal is carried simultaneously on a separate light wavelength. Using WDM, separate wavelengths or channels of data are multiplexed into a stream that is transmitted on a single optical fiber. As many as 80 channels of data may be transmitted this way. Each channel carries a time division multiplexed (TDM) signal.

Each channel is demultiplexed back into the original signal at the end of the optical fiber. Different data formats can be transmitted together at different data rates using WDM. For example, Internet packet (IP) data, synchronous optical network (SONET) data, and asynchronous transfer mode (ATM) data can all travel at the same time within an optical fiber.

All-optical WDM networks offer a novel solution for transmission of high bandwidth over large distances in a highly cost effective way. Future networks are expected to use the all-optical advantage in which data does not have to be converted back into electrical formats for regeneration, reshaping and conversion. In order to fully exploit the benefits of an all-optical network, there is a need for a cost effective component that will support signal regeneration and wavelength conversion. Regeneration should be performed in a network in order to correct distortions and noise accumulated by the signal after traveling through long spans of fibers, optical amplifiers, erbium-doped fiber amplifiers (EDFA), optical repeaters, and add/drop or cross connect stations.

Wavelength conversion is needed to prevent wavelength blocking in the network. Wavelength blocking occurs when two different users attempt to use the same wavelength in one port. Current technology for signal regeneration is based on optics-electronics-optics (OEO) transponders. These transponders regenerate the signal by converting the lightwave to an electrical signal in a receiver, cleaning the noise from the electrical signal, and re-transmitting the clean signal by imposing the clean bits on an optical modulator. The transponder may use a tunable laser as the new optical source and may perform wavelength conversion of the input signal.

Problems with OEO solutions include a high cost for high bit rates, non-transparency for bit rate, protocol or bit shape, and latency problems in long networks.

SUMMARY

The present invention is optimized for return-to-zero (RZ) transmission. Those of skill in the art will recognize that the invention may also support non-return-to-zero (NRZ) transmission. Systems incorporating the present invention are transparent to the bit shape, bit rate and protocol of the RZ transmission. The device is based on mature subcomponents and incorporates a simple and robust design. Therefore, the invention is low cost in nature and very reliable in performance. The systems and methods described herein are a substantial improvement over the prior art, such as that disclosed in J. Leuthold et. al., Proc. LEOS 2002 Annual Meeting, Glasgow, Scotland, Post deadline paper PD 1.3, Nov. 2002, the disclosure of which is incorporated herein by reference in its entirety.

The invention consists of a tunable continuous wave (CW) laser source, an optical circulator, a semiconductor optical amplifier (SOA), and a spectral filter that has a very sharp cutoff frequency. In alternative embodiments, the filter may be replaced with an interleaver that passes several wavelengths. A single interleaver may be used by several of the optical regenerators/converters described herein. Each regenerator uses a separate wavelength that is associated with a passband frequency of the single interleaver. An interleaver has a periodic nature in which the blocking and transmitting sections of the spectrum repeat over a pre-specified frequency span, such as every 100 GHz.

By using a single, fast SOA per wavelength to convert and regenerate the input signal, the present invention provides a cost advantage over the prior optical regeneration and conversion systems.

It is an object of the present invention to provide a device and method for regenerating and reshaping optical signals and for converting the wavelength of optical signals, in an all-optical manner, without the use of OEO solutions.

It is a further object of the invention to cause an input data signal and a CW signal to counter-propagate in the SOA so that any color input signal can be converted to any color output signal.

It is an additional object of the invention to regenerate different wavelengths in parallel using one interleaver filter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

DETAILED DESCRIPTION

Figure 1:
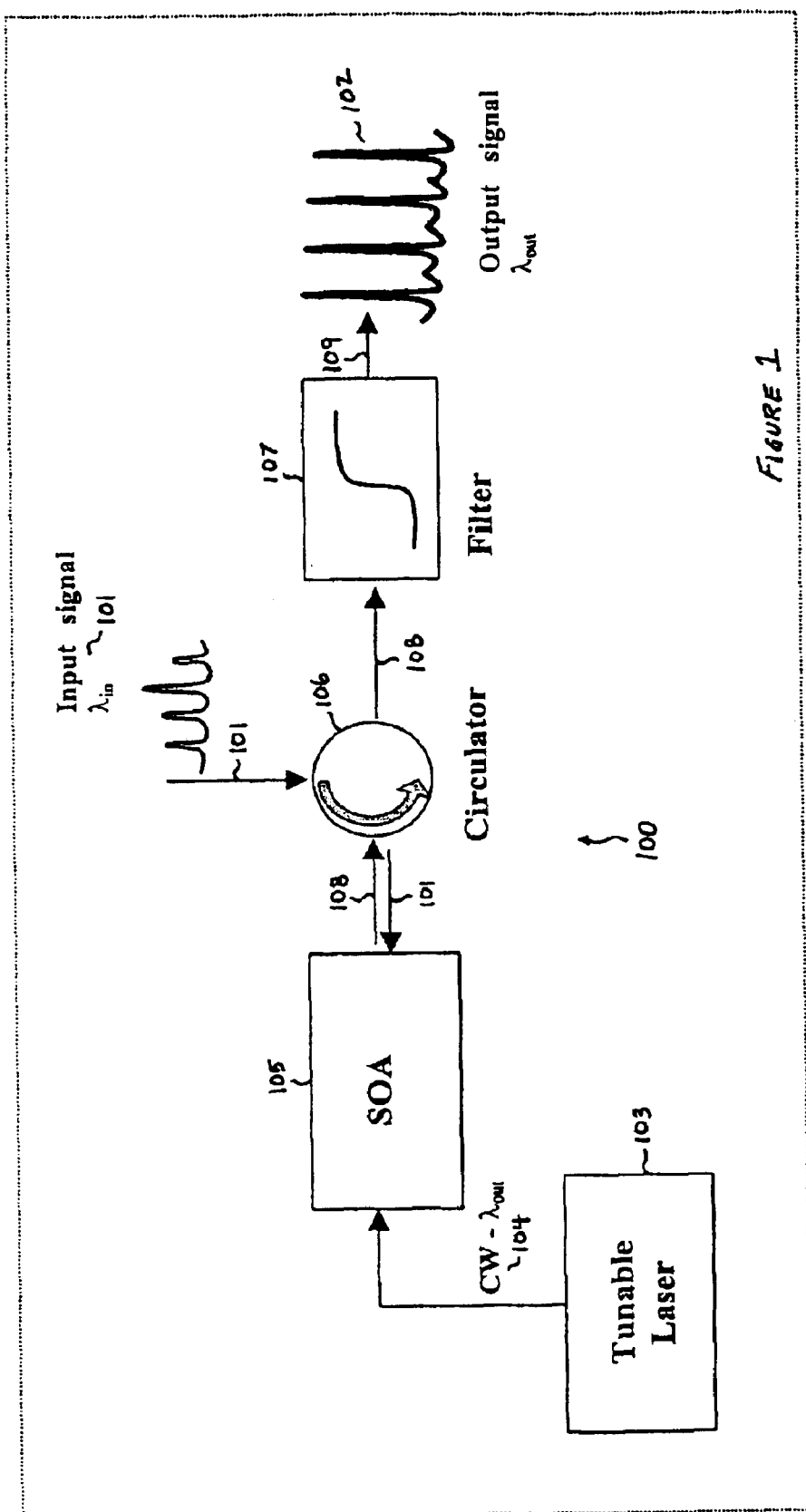
FIG. 1 is a high-level block diagram of a system incorporating an embodiment of the present invention.

FIG. 1 is a high-level block diagram of system 100 incorporating embodiments of the present invention. System 100 can be used as a signal regenerator, as a bit reshaper, and as a wavelength converter. Input signal 101 represents a signal that has been transmitted over some distance and has become noisy and degraded. The bits in signal 101 have lost shape, are not symmetrical, and have different bit heights. The present invention provides a system and method for regenerating the input signal, for reshaping the bits and for converting the input signal to a new wavelength, if desired. Output signal 102 is the regenerated signal after being processed by the present invention, wherein the bits of output signal 102 are clean and reshaped.

Input signal 101 is received at optical circulator 106 and is directed into semiconductor optical amplifier (SOA) 105. Tunable laser 103 generates continuous wavelength (CW) signal 104, which is an un-modulated signal of constant power level. CW signal 104 is directed into SOA 105. CW signal 104 and input signal 101 counter-propagate in SOA in a cross-gain mode. As a result of this counter-propagation, the bits of the input signal are inversely copied onto CW signal 104. The modulated CW signal is output (108) to circulator 106.

After passing through circulator 106, modulated signal 108 is directed to filter 107. The wavelength of laser 103 is tuned such that the frequency of CW signal 104 falls just below the cutoff frequency near the edge of filter 107. As a result, any CW light 104 that passes through SOA 105 and circulator 106 is blocked by filter 107. In other embodiments, filter 107 is tunable and may be tuned relative to a selected CW wavelength so that the CW frequency is maintained just below the cutoff frequency.

Figure 2:
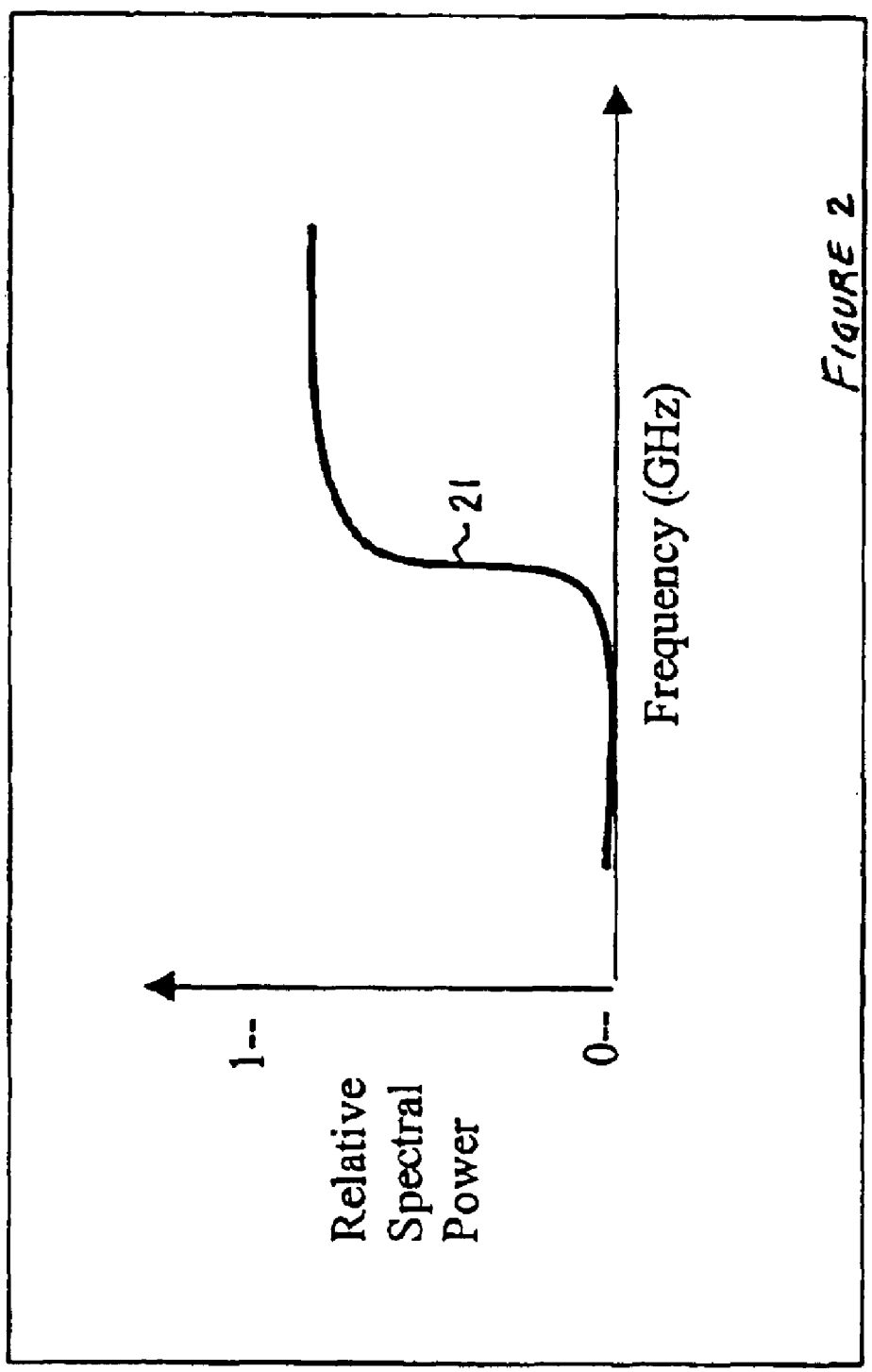
FIG. 2 illustrates a desired frequency response of a filter used in the system of FIG. 1.

FIG. 2 illustrates a desired frequency response 21 of filter 107. In a preferred embodiment, frequency response curve 21 is very sharp and closely approximates a step function in which all frequencies (or wavelengths) below the cutoff frequency are blocked, while frequencies (or wavelengths) above the cutoff frequency are passed though filter 107 without distortion. The shape of filter 107 ideally should have a perfect square shape, which means that the transmission between the blocking band and the transmission band will be abrupt and infinitesimally sharp.

By fine tuning the edge of filter 107 relative to the signal wavelength, one can place a threshold, for which CW signal 108 will be compressed to "0" below the threshold and will be stretched to create a new "1" bit above the threshold. Output signal 109 then will have a high extinction ratio (ER) (i.e. the ratio between the "1" average power and the "0" average power) and very good signal-to-noise ratio (SNR), even if input signal 101 had a low ER and SNR.

In order to improve the bit error rate (BER) of the signal, the stretching on the "1" bits and the compression of the "0" bits should be around a certain and accurate threshold, that is calculated according to the distribution of the noise around the 1s' and the 0s' in the original noisy signal. If an erroneous level is set, then the output bits will be reshaped by the regenerator, but the output signal will have a higher BER than the original input signal. Therefore, if the edge of the filter is not sharp enough, then the threshold cannot be set in the right position and real regeneration of the signal (i.e. low output signal BER) will not happen.

Referring again to FIG. 1, system 100 may be used in an optical network to connect optical fiber links. Input signal 101 has traveled through a portion of the optical network and has become degraded and noisy. Accordingly, input signal 101 needs to be regenerated and possibly converted to a new wavelength. Circulator 106 guides input signal 101 into SOA 105. At the same time, CW signal 104 enters SOA 105. Input signal 101 and CW signal 104 counter-propagate within SOA 105. If input signal 101 has no "1" bits in its content, then it does not affect the wavelength of CW light 104 passing through SOA 105. In that case, no light passes out of system 100 because the CW light (108) is blocked by filter 107.

However, when a "1" bit appears in input signal 101, it slightly and shortly (relative to the bit length) changes the refractive index of SOA 105 by changing its carrier density. Therefore, CW light 104 is also slightly and shortly chirped in frequency (or wavelength) in SOA 105. The chirped content of the light (108) has higher frequency than CW signal 104 and when the chirped signal (108) is passed to filter 107, it falls into the passband of filter 107. This creates a new "1" bit at the output (109) of filter 107 that rides on a new wavelength compared to wavelength of input signal 101.

The output bit is reshaped and amplified and is carried by a new wavelength that may be selected by using frequency of laser 103. If wavelength conversion is not desired or required in system 100, for example, if system 100 is used strictly as a regeneration device, then laser 103 does not have to be tunable, but may have a constant wavelength. In such embodiments, system 100 provides wavelength regeneration only without selectable frequency conversion.

System 100 reshapes the bits of input signal 101 because any noise contained on the "0" bits of input signal 101 are not transmitted through filter 107. Only significant signal changes, such as those contained in the "1" bits, cause the chirped light to cross the filter and to be transmitted forward.

System 100 also provides noise reduction in the "1" bits by clipping the "1" bits at an upper level. If the input bit power is above a certain threshold, it will saturate the gain of SOA 105 and will not effect the counter-propagating CW light beyond a certain level. Therefore, any fluctuation in excess of the saturation point will not be translated into bit fluctuations in the output signal (108). As a result, output signal 102 from SOA 105, and later on after passing through filter 107, has clipped bits and has a compressed and clean zero level. These features provide a regenerated signal 109 that has a better BER then original input signal 101.

Input signal 101 is not only converted to output signal 109, but is also amplified by SOA 105 which acts both as a converter and as an amplifier for the optical signal. Therefore, system 100 acts as a pure optical "2R" (i.e. reamplification and reshaping) regenerator and wavelength converter. System 100 cleans noisy signal 101 and brings back the symmetrical shape of the original bits and produces an output signal in which the bits are aligned, very sharp and have equal power.

System 100 can also be used as a "3R" (i.e. reamplification, reshaping, and resynchronization (or retiming)) regenerator The system of FIG. 1, which includes one SOA per channel and counter-propagation of the input signal and the CW laser through the SOA, is a significant and novel improvement of the prior art. By using counter-propagation through the SOA, it is possible to regenerate an input signal having a particular wavelength to an output signal of the same wavelength. This would be impossible if the input signal and the CW laser were to co-propagate through the SOA. This feature is extremely important in regenerators because most of the traffic will remain on its original wavelength after passing through a regeneration station.

Figure 3:
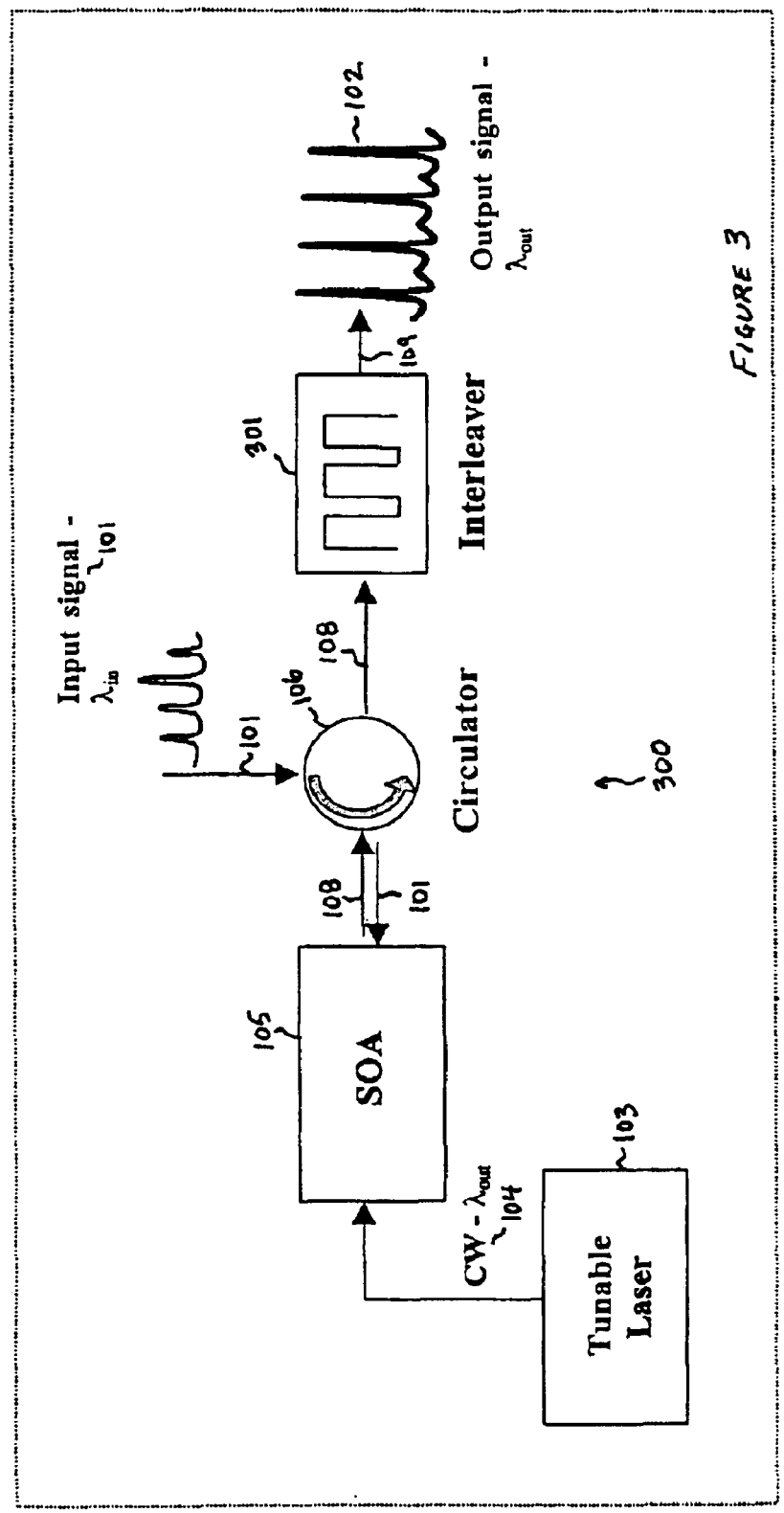
FIG. 3 is block diagram of a system incorporating an alternative embodiment of the present invention.

FIG. 3 is block diagram of system 300 incorporating an alternative embodiment of the present invention. System 300 is almost identical to system 100 of FIG. 1, however, filter 107 has been replaced by interleaver 301.

Figure 4:
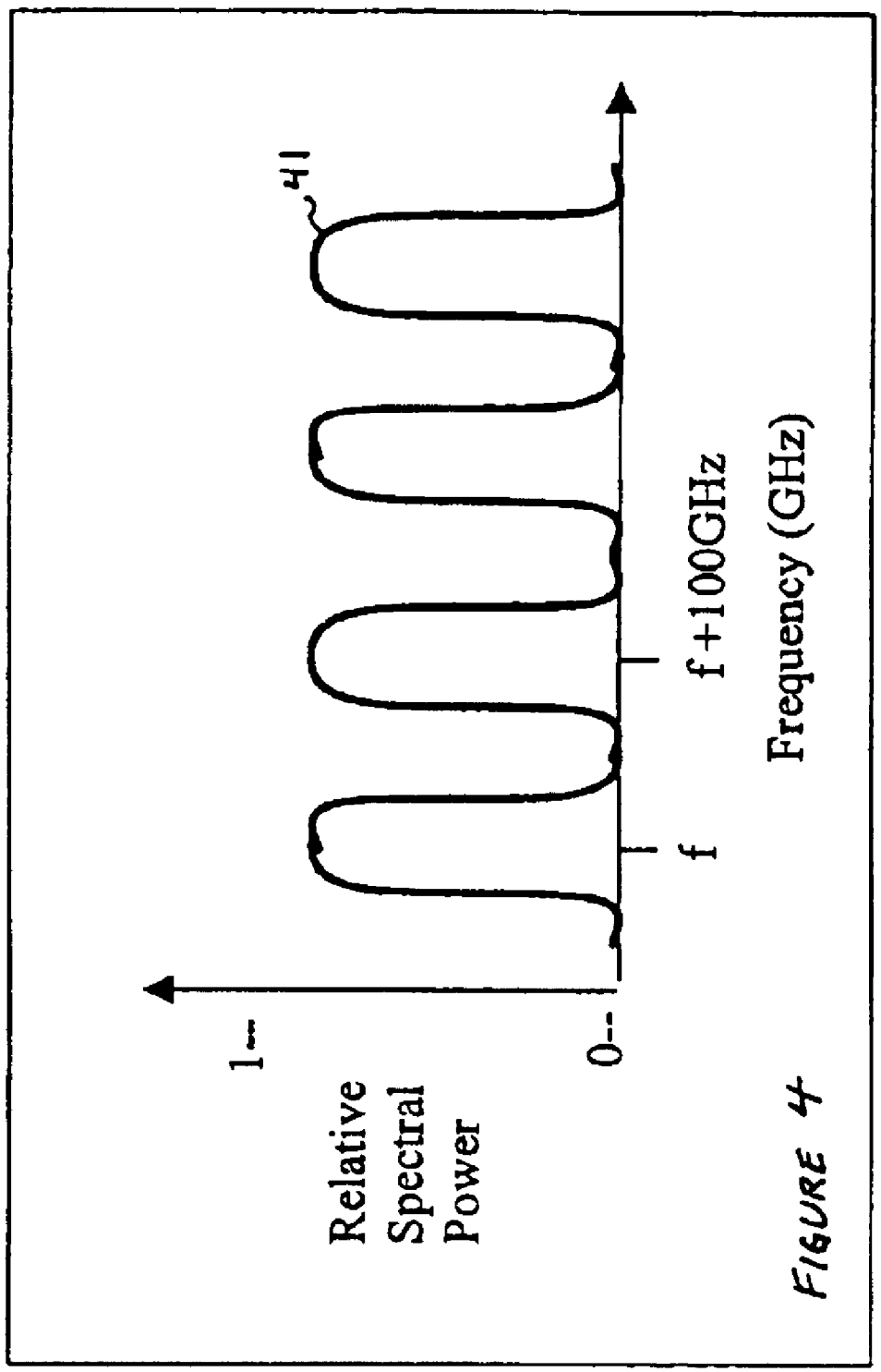
FIG. 4 illustrates a frequency response of an exemplary interleaver.

An interleaver is a periodic filter that has periodic transmission and blocking bands in the frequency domain. FIG. 4 illustrates frequency response or spectral shape 41 of an exemplary interleaver. The period of the frequency passbands set the type or name of the interleaver. For example, a "50 GHz/100 GHz interleaver" has a period of 100 GHz in frequency and the spacing between a blocking band and a neighboring transmission band is 50 GHz. Frequency response 41 depicts a typical spectral shape of a 50 GHz/100 GHz interleaver.

An interleaver has two main advantages that are of use in a regenerator. First, interleavers have very sharp edges (a drop of 20 dB over 5 GHz is possible) and very flat and square bands. Second, interleavers are periodic in frequency. The transmission bands are accurately spaced according to the ITU grid. Thus, interleavers can handle multiple input wavelengths in a DWDM network, where the wavelengths are spaced according to the ITU grid. The interleaver can simultaneously perform the same regeneration function for all of these wavelengths without any cross-talk among the wavelengths.

A typical interleaver would be a 50 GHz to 100 GHz interleaver. The passbands of the interleaver filter are periodic in frequency wherein the interleaver transmits the input light around each peak and blocks the input light around each valley. The typical ratio between the peaks and valleys in an interleaver is 40 dB, and an edge slope of 20 dB/5 GHz is achievable.

In FIG. 3, interleaver 301 is used as a filter in the same manner as described for filter 107 in FIG. 1. The square shape of the transmission and blocking bands in interleaver 301 along with the sharp edges of the frequency response curve make the design extremely regenerative.

Figure 5:
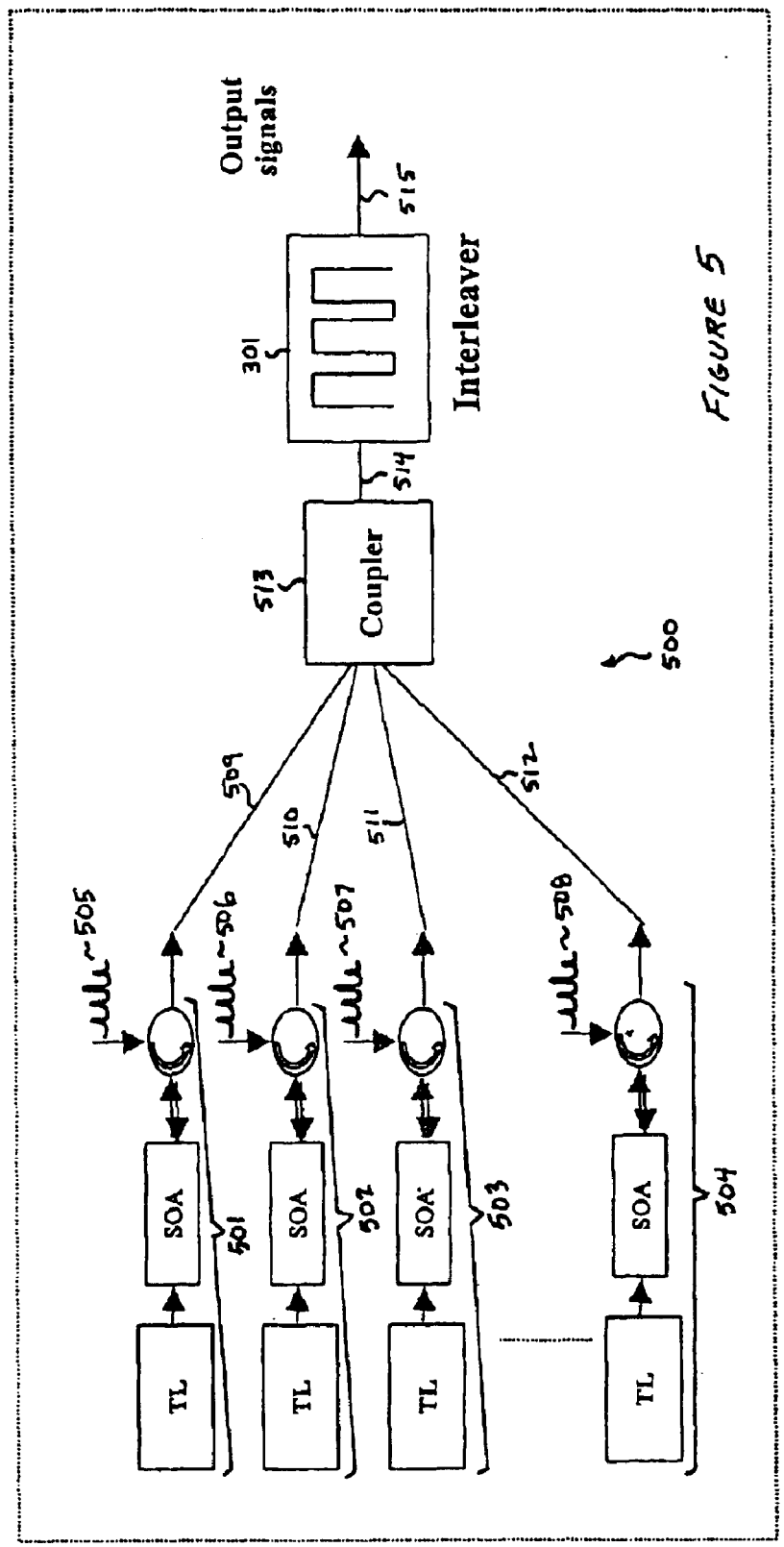
FIG. 5 is a block diagram of system 500 for providing simultaneous regeneration and conversion for multiple input signals 505–508.

FIG. 5 is a block diagram of system 500 for providing simultaneous regeneration and conversion for multiple input signals 505–508. System 500 is a multi-wavelength regenerator and wavelength converter. Every input signal 505–508 is processed by its own regenerator and conversion circuit 501–504, respectively. Each of circuits 501–504 are similar to systems 100 and 300 in FIGS. 1 and 3. However, in system 500, regeneration and conversion circuits 501–504 share interleaver 301. Circuits 501–504 receive input signals 505–508 and, in the manner described above, regenerate and convert input signals 505–508 to signals 509–512. Instead of using separate filters or interleavers for each wavelength, system 500 combines signals 509–512 in coupler 513 and feeds combined signal 514 to a single interleaver 301.

Input signals 505–508 ride on different wavelengths and are directed to individual SOA units, in which input signals 505–508 counter-propagate with a CW wavelength coming from separate CW sources. These CW sources may be tunable or fixed depending upon the needs and use of system 500. The SOAs may be single devices or an array of SOAs that are packaged together in one unit. Interleaver 301 performs the same function for each of the signals 509–512. Chirped "1" bits on each wavelength are allowed to pass, but the original CW wavelengths are blocked. As a result, output 515 includes regenerated bits on separate wavelengths corresponding to the bits on the original input signals 505–508. The CW sources are tuned or tunable to work with the passbands of interleaver 301.

The input and output wavelengths of system 500 may cover any combination and may support true any-to-any wavelength conversion, as long as the basic spacing of the CW sources is around the ITU grid, which is typically the case in WDM networking. All output signals 509–512 from the right side of the SOAs are grouped together into one fiber by a standard star coupler 513, which alternatively may be an arrayed waveguide grating (AWG) or wavelength grating router (WGR). That fiber enters interleaver 301, where any of the chirped CW wavelengths fall into one of the bands of the interleaver (FIG. 4) and undergo simultaneous regeneration. The interleaver works for very low input powers, which helps in performing regeneration because the original signals lose a substantial amount of power when they pass through coupler 513.

It is possible to have multi-wavelengths input into one interleaver and to have any-to-any wavelength conversion in the device, without blocking of certain wavelengths, only by using a counter-propagation scheme as illustrated herein. If the input signals and the CW sources co-propagate through the SOAs, then the original input wavelengths have to be filtered out of the output signal. That means that these wavelengths cannot be used for a "convert to" or output wavelength by the device since the wavelengths will be dropped later by an extra external filter. This also means that an extra external filter is needed for a co-propagation scheme. Such an external filter would have to be tunable or multi-wavelength, and would add significantly to the cost and complexity of the device versus the counter-propagation scheme of the present invention.

The novel and unique design described herein provides the following advantages:

The design is very simple and consists of very few components. This makes the conversion and regeneration device low cost, robust, and highly reliable, which are critical features if one looks to replace the existing OEO solutions that are used in optical networks.

The design supports true multi-wavelength conversion and regeneration, and enables switching between any input wavelength to any output wavelength, including same wavelength, using only one filter/interleaver.

The invention performs "2R" and "3R" signal regeneration and wavelength conversion in one unit. The invention provides "2R" substantial regeneration and allows the signal to be transmitted over tens of thousands of kilometers of fiber while maintaining good BER when measured by an electronic receiver.

The invention does not require an external, tunable filter to block the original input signal in every channel. This lowers the cost and complexity of the system.

The power level of the input signal can be very low because the SOA amplifies the signals that are passed to the filter/interleaver.

The device is fully transparent to bit shape, bit rate and protocol of the input signal. The transparency can be achieved for input signals up to 40 Gb/s as long as the SOA is suitably designed to support amplification of 40 Gb/s bit rates.

NRZ transmission may also be supported in the same manner described above by replacing the SOA with a device that creates adiabatic chirp and not just transient chirp. Transient chirp is a change of frequency of the CW signal that passes through the SOA, when a sudden change of the SOA gain occurs. Such a sudden change happens with the transients of an input bit from "0" level to "1" level or vise versa. Adiabatic chirp means that the frequency of the CW signal that goes through the device has the same pattern as the absolute power of the input bits of the counter propagating signal. That is, as long as the input signal is in the "1" level, the frequency of the CW is in one frequency; and when the signal is in the "0" level, the CW will go to a second frequency. Adiabatic chirp replicates the input bit modulation onto the frequency modulation of the CW wavelength that goes through the device. Therefore, this effect allows for an NRZ pattern to be replicated into the new CW wavelength and then to be filtered through the same output filter of the system.

An adiabatic device may be, for example, an electroabsorption modulator (EAM) with its input voltage modulated by an NRZ signal. Such a scheme will create adiabatic chirp that will be replicated to the CW laser that counterpropagates inside the EAM. The net result of that new CW signal passing the spectral filter at the output of the system is a new regenerated NRZ signal in the new CW wavelength. The EAM would replace the SOA shown in FIGS. 1, 3 or 5, for example, in such an NRZ system.

Figure 6:
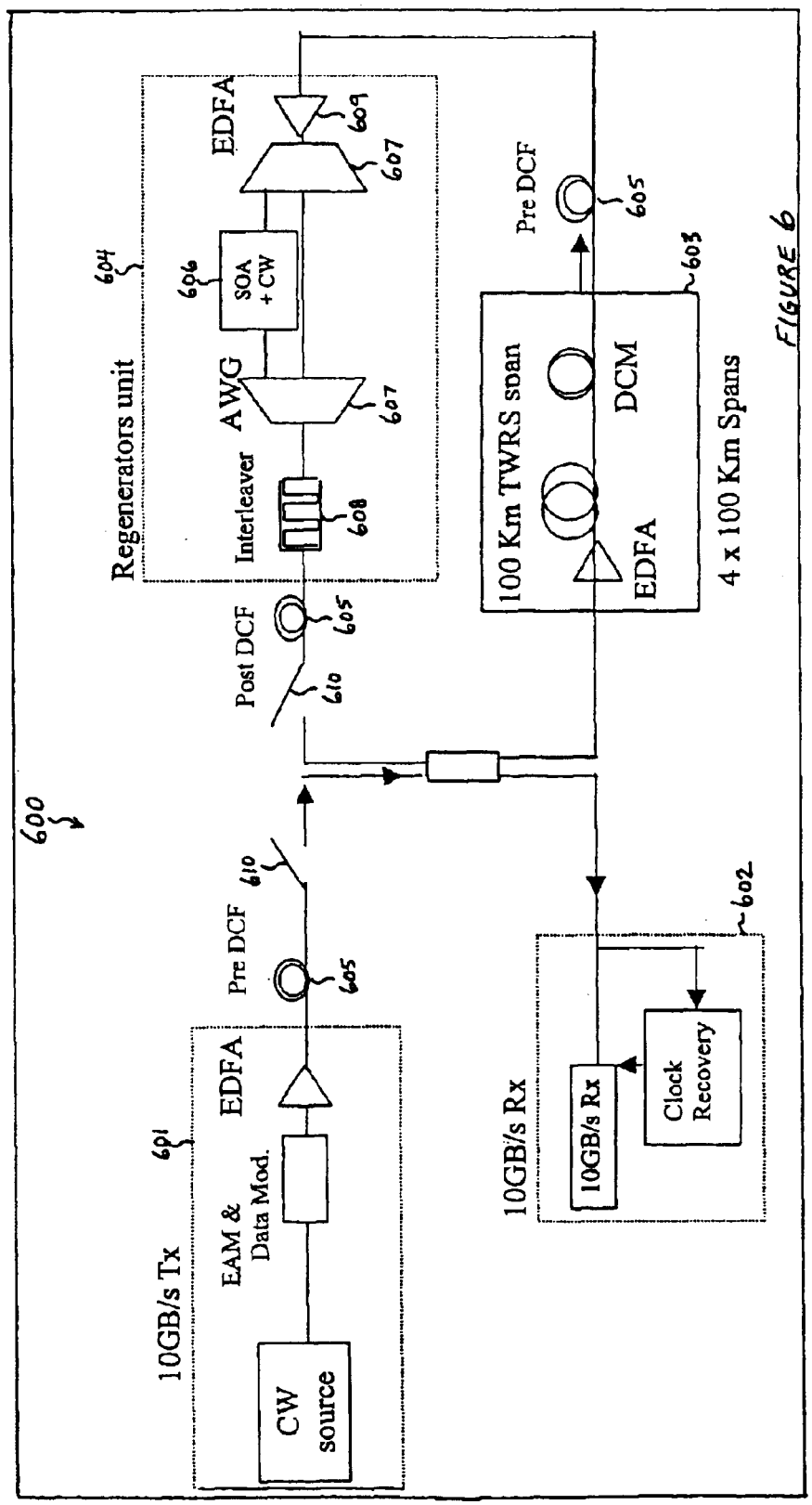
FIG. 6 is a block diagram of a network that can be used to test the present invention and to prove the concept of operation.

FIG. 6 is a block diagram of network 600 that can be used to test the present invention and to prove the concept of operation. Network 600 consists of four major parts: transmitter 601, receiver 602, fibers and compensators 603, and regeneration unit 604. The loop test is set up so that a 10 Gb/s EAM transmitter creates a 33% RZ signal with a bit pattern of $2^{31}-1$. That signal then introduced in and out of the loop via two fast acousto-optics switches 610. The loop consists of 4 spans of 100 Km of TrueWave Reduced Slope fibers with proper dispersion compensation along the loop.

Transmitter 601 consist of a distributed feedback (DFB) laser that is guided through an EAM, where that modulator creates the RZ bits at 10 GB/s. The data of 10 Gb/s with a bit pattern of PRBS $2^{31}-1$ is then encoded on the bits using a LiNbO3 (lithium neobate) modulator.

Receiver 602 consists of a clock recovery module and wide-bandwidth optical receiver attached to a BER tester.

The transmission section 603 of the loop consists of 4 spans of fibers. Each fiber span is a 100 km of TrueWave Reduced Slope (TWRS) nonzero dispersion fiber and a dispersion compensating fiber (DCF) for dispersion compensation. Each span also includes an EDFA to overcome the span loss of roughly 20 dB. Pre and post dispersion compensation 605 is also integrated into the loop to fully adapt the dispersion map of the system within the loop. The dispersion compensation occurs before the loop entrance and before and after regeneration unit 604.

Regeneration unit 604 includes several regenerators for simultaneous wavelength conversion and regeneration. Regeneration unit 604 is essentially the same as system 300 of FIG. 3. Although just one signal having one wavelength was tested in the proof of concept, the SOA and CW source (606) are located between two AWG filters 607 that select the proper input wavelength to be regenerated. The output goes through interleaver 608 and then into the loop for further transmission. EDFA 609 is set before the first AWG in order to compensate for the losses presented by the two AWGs.

Figure 7:
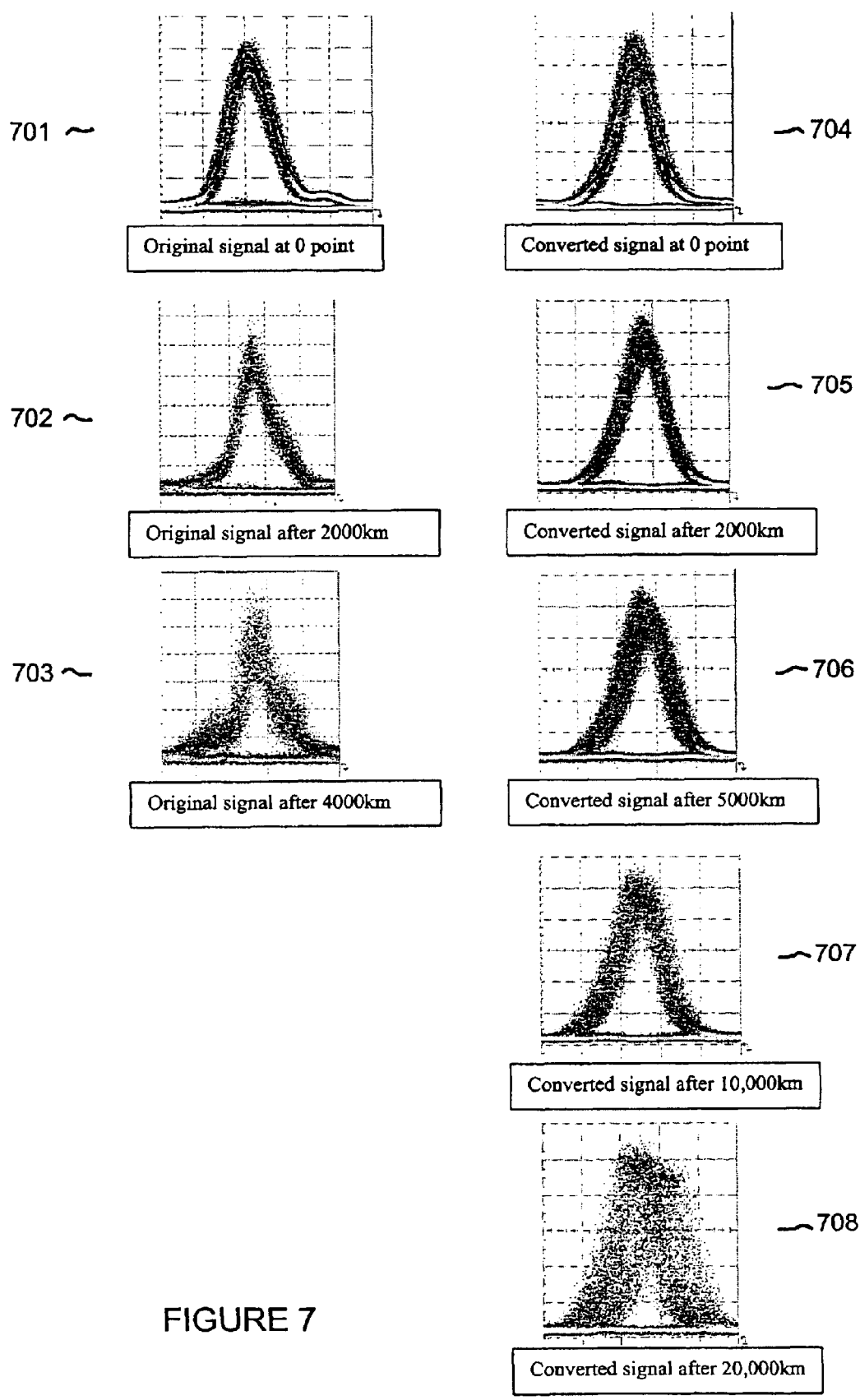
FIG. 7 illustrates sample results from a loop test of the present invention.

A test signal is introduced into the loop from transmitter 601. The test signal passes through 400 km of fiber in transmission section 603 where it degrades over that distance. The test signal is then regenerated in regeneration unit 604 and again put through the 400 km fiber where it is further degraded. The test signal is received and the BER evaluated in receiver 602 after travelling through multiple loops and covering various distances Sample results from the loop test are presented in FIG. 7. Although the original RZ signal has excellent optical features, such as good SNR and good ER, it did not manage to travel more than 4000 km through the loop without regeneration. Graph 701 is the original test signal from transmitter 601. After traveling 2000 km (5 loops) without regeneration, the test signal was degraded as shown in graph 702. After traveling 4000 km (10 loops) without regeneration, the test signal degraded as shown in graph 703. The unregenerated 4000 km signal was not symmetrical and was noisy with an unacceptable BER.

Graphs 704–708 illustrate the test signal after it travels various distances with regeneration from regeneration unit 604. After inserting regeneration unit 604 into the loop, the regenerated test signal managed to travel over 20,000 km (50 loops). All of the signals, including those that had traveled over 20,000 km (graph 708), were measured to have BER<$10^{-9}$ for the RZ 10 Gb/s PRBS $2^{31}-1$ original signal. The quality of the signal was very good with high ER and Q.

Figure 8:
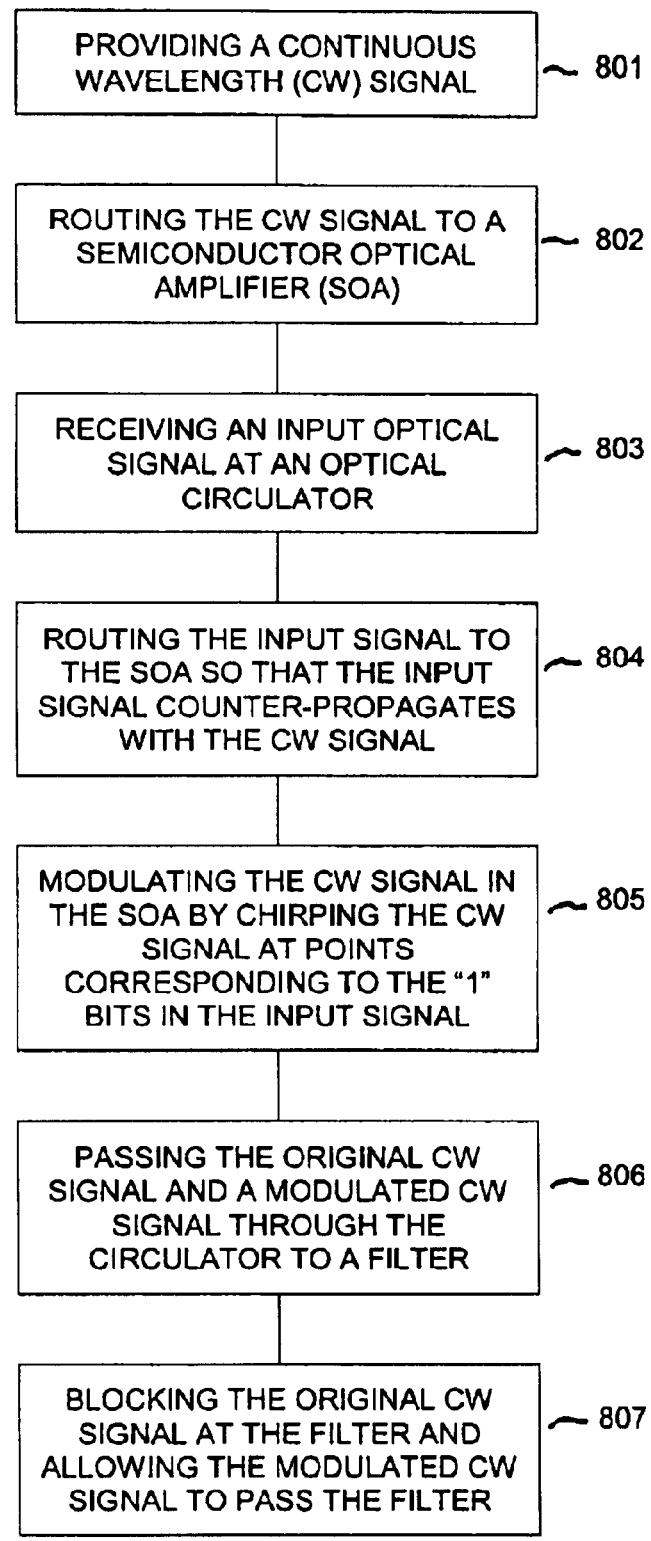
FIG. 8 is a flowchart illustrating a process of regenerating and converting optical signals according to embodiments of the present invention.

FIG. 8 is a flowchart illustrating a process of regenerating and converting optical signals according to embodiments of the present invention. At 801, the system provides a CW signal. The CW signal source may be either fixed or tunable depending upon the desired application. At 802, the CW signal is routed to an SOA. An input optical signal is received by an optical converter at 803, which may occur simultaneously with or before processes 801 and 802. The input signal is routed to the SOA at 804 in a manner that causes the input optical signal to counter-propagate with the CW signal.

At 805, the "1" bits in the input optical signal are modulated onto the CW signal in the SOA by chirping points in the CW signal that correspond to the "1" bits in the input optical signal. The original CW signal and the modulated CW signal are passed at 806 from the SOA through the optical circulator to a filter. The filter blocks the original CW signal and passes the modulated CW signal at 807, so that the output of the system is a regenerated and converted signal with bits corresponding to the bits of the original signal. Furthermore, the bits of the original signal have been cleaned up in the output signal in that the bits are reshaped and have consistent heights. The bits in the output signal at the filter may also be resynchronized or re-timed by the system.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for regenerating optical signals comprising:
    counter-propagating the optical signal and a continuous wavelength (CW) signal;
    creating a chirped output signal having bits that correspond to the "1" bits in the optical signal; and
    filtering signals to pass the chirped output signal and to block the CW signal.

2. The method of claim 1 wherein the counter-propagating is performed in a device that creates a transient chirp.

3. The method of claim 1 wherein the counter-propagating is performed in a semiconductor optical amplifier (SOA).

4. The method of claim 1 wherein the counter-propagating is performed in a device that creates an adiabatic chirp.

5. The method of claim 1 wherein the counter-propagating is performed in a electro-absorption modulator (EAM).

6. The method of claim 1 wherein the chirped output signal comprises regenerated bits from the optical signal.

7. The method of claim 1 wherein the chirped output signal comprises reshaped bits from the optical signal.

8. The method of claim 1 wherein the chirped output signal comprises re-amplified bits from the optical signal.

9. The method of claim 1 wherein the chirped output signal comprises resynchronized bits from the optical signal.

10. The method of claim 1 wherein the chirped output signal is at a same wavelength as the original optical signal.

11. The method of claim 1 wherein the chirped output signal is at a different wavelength than the original optical signal.

12. The method of claim 11 wherein the wavelength of the chirped output signal is selected by tuning the CW signal.

13. The method of claim 1 wherein the filter is a high pass filter.

14. The method of claim 13 wherein the high pass filter has a frequency response approximating a step function.

15. The method of claim 1 wherein the filter is an interleaver.

16. The method of claim 1 further comprising:
    simultaneously filtering a plurality of chirped output signals in an interleaver, wherein the plurality of chirped output signals each have a different wavelength.

17. A method for regenerating a plurality of optical signals comprising:
    counter-propagating each of the optical signals with a separate continuous wavelength (CW) signal, wherein each of the separate CW signals has a different wavelength;
    creating a separate chirped output signal for each of the plurality of the optical signals, wherein each chirped output signal has bits that correspond to the "1" bits in a corresponding optical signal; and
    filtering signals to pass only the separate chirped output signals and to block the CW signals.

18. The method of claim 17 wherein the filtering is performed in a single interleaver.

19. The method of claim 17 wherein each of the optical signals and a corresponding CW signal is counter-propagating in a separate semi-conductor optical amplifier (SOA).

20. The method of claim 17 wherein the wavelengths of the separate chirped output signals are selected by tuning a corresponding CW signal.

21. The method of claim 17 wherein the wavelengths of the separate chirped output signals are tuned to a separate passband of the interleaver.

22. A system for regenerating optical signals comprising:
    a semi-conductor optical amplifier (SOA) coupled to an input optical signal;
    a continuous wavelength (CW) laser coupled to the SOA, wherein a CW signal from the laser and the input optical signal counter-propagate in the SOA in a cross-gain mode to generate an output signal; and
    a filter coupled to the SOA and that passes the output signal and blocks the CW signal.

23. The system of claim 22 further comprising:
    an optical circulator coupled between the SOA and the filter, wherein the optical circulator receives the input optical signal and directs the input optical signal to the SOA, and wherein the circulator passes the output signal from the SOA to the filter.

24. The system of claim 22 wherein the CW laser is tunable.

25. The system of claim 24 wherein the wavelength of the output signal is selectable by tuning the wavelength of the CW signal.

26. The system of claim 22 wherein the filter is a high pass filter.

27. The system of claim 22 wherein the high pass filter has a frequency response approximating a step function.

28. The system of claim 22 wherein the filter is an interleaver.

29. The system of claim 28 wherein the interleaver is coupled to multiple SOAs circuits.

30. The system of claim 22 wherein the output signal comprises "1" bits that correspond to the "1" bits of the input optical signal.

31. The system of claim 30 wherein the bits in the output signal are regenerated from the bits of the input optical signal.

32. The system of claim 30 wherein the bits in the output signal are reshaped bits from the input optical signal.

33. The system of claim 30 wherein the bits in the output signal are re-synchronized bits from the input optical signal.

34. The system of claim 30 wherein the bits in the output signal are re-amplified bits from the input optical signal.

35. A system for regenerating optical signals comprising:
    a continuous wavelength (CW) laser;
    an electro-absorption modulator (EAM) coupled to the CW laser, wherein a CW optical signal from the CW laser and an input optical signal counter-propagate in the EAM to create a chirped output signal; and
    a filter coupled to the EAM wherein the filter passes the chirped output signal and blocks the CW optical signal.

36. A system for simultaneously regenerating a plurality of optical signals comprising:
    a separate semiconductor optical amplifier (SOA) for receiving each of the plurality of optical signals;
    a separate continuous wavelength (CW) laser coupled to each of the separate SOAs, each of the CW lasers providing a CW signal that counter-propagates with one of the optical signals in the SOA to produce a chirped output signal; and an interleaver that receives the chirped output signal from each of the SOAs, wherein the interleaver passes each of the chirped output signals and blocks each of the CW signals.

37. The system of claim 36 further comprising:
a coupler coupled between the filter and each of the SOAs, wherein the coupler combines the chirped output signals and provides them to the filter.

38. The system of claim 36 wherein the separate CW lasers are tunable.

39. The system of claim 38 wherein wavelengths of the chirped output signals are determined by a wavelength selected for each of the corresponding tunable CW lasers.

40. The system of claim 38 wherein each of the CW signals are selected so that corresponding chirped output signals are passed by a passband of the interleaver.

41. An optical network comprising:
one or more incoming optical fibers connected to an optical regeneration device;
the optical regeneration device comprising:
a plurality of semiconductor optical amplifiers (SOA) for receiving a plurality of incoming optical signals on the one or more incoming optical fibers, wherein individual incoming optical signals are directed to each of the SOAs;
a separate continuous wavelength (CW) laser coupled to each of the SOAs, each of the CW lasers providing a CW signal that counter-propagates with the individual incoming optical signal in the SOA to produce a chirped output signal; and
an interleaver that receives the chirped output signals from each of the SOAs; and
one or more outgoing optical fibers connected to the interleaver, wherein the chirped output signals are passed to the one or more outgoing optical fibers by the interleaver and the CW signals are blocked from the outgoing optical fibers by the interleaver.

42. The optical network of claim 41 wherein the chirped output signals correspond to the incoming optical signals, and wherein the wavelengths of the chirped output signals have converted from the wavelength of the correspond incoming optical signals.

43. The optical network of claim 42 wherein the separate CW lasers are tunable to select the wavelength of the output signals.

44. The optical network of claim 41 further comprising:
a coupler coupling the plurality of SOAs to the interleaver.

45. The optical network of claim 41 further comprising:
an optical circulator coupling the plurality of SOAs to the interleaver and coupling the incoming optical signals from the one or more incoming optical fibers to the SOAs.

46. The optical network of claim 41 wherein the SOAs create a transient chirp in the respective CW signals, wherein the transient chirp corresponds to "1" bits in the incoming optical signals.

47. The optical network of claim 41 wherein each of the chirped output signals comprise regenerated bits from a corresponding incoming optical signal.

48. The optical network of claim 41 wherein each of the chirped output signals comprise reshaped bits from a corresponding incoming optical signal.

49. The optical network of claim 41 wherein each of the chirped output signals comprise re-amplified bits from a corresponding incoming optical signal.

50. The optical network of claim 41 wherein each of the chirped output signals comprise resynchronized bits from a corresponding incoming optical signal.

51. The optical network of claim 41 wherein each of the chirped output signals is at a same wavelength as a corresponding incoming optical signal.

52. A system for regenerating optical signals comprising:
means for counter-propagating the optical signal and a continuous wavelength (CW) signal;
means for creating a chirped output signal having bits that correspond to the "1" bits in the optical signal; and
means for filtering signals to a pass the chirped output signal and to block the CW signal.

53. The system of claim 52 wherein the counter-propagating means creates a transient chirp in the CW signal.

54. The system of claim 52 wherein the counter-propagating means creates an adiabatic chirp in the CW signal.

55. The system of claim 52 wherein the chirped output signal comprises regenerated bits from the optical signal.

56. The system of claim 52 wherein the chirped output signal comprises reshaped bits from the optical signal.

57. The system of claim 52 wherein the chirped output signal comprises re-amplified bits from the optical signal.

58. The system of claim 52 wherein the chirped output signal comprises resynchronized bits from the optical signal.

59. The system of claim 52 wherein the chirped output signal is at a same wavelength as the original optical signal.

60. The system of claim 52 wherein the chirped output signal is at a different wavelength than the original optical signal.

61. The system of claim 60 wherein the wavelength of the chirped output signal is selected by tuning a means for producing the CW signal.

62. The system of claim 52 wherein the filter is a high pass filter.

63. The system of claim 62 wherein the high pass filter has a frequency response approximating a step function.

64. The system of claim 52 wherein the filter is an interleaver.

65. The system of claim 52 further comprising:
means for simultaneously filtering a plurality of chirped output signals in an interleaver, wherein the plurality of chirped output signals each have a different wavelength.

* * * * *